United States Patent [19]
Schneider

[11] Patent Number: 5,559,454
[45] Date of Patent: Sep. 24, 1996

[54] CIRCUIT ARRANGEMENT FOR SIGNAL PROCESSING FOR INDUCTIVITY USING SENSOR

[75] Inventor: Thomas Schneider, Markgroeningen, Germany

[73] Assignee: Robert Bosch GmbH, Stuttgart, Germany

[21] Appl. No.: 349,612

[22] Filed: Dec. 5, 1994

[30] Foreign Application Priority Data

Dec. 14, 1993 [DE] Germany .................. 43 42 585.2

[51] Int. Cl.⁶ ........................................... G01R 25/00
[52] U.S. Cl. ..................... 327/4; 327/510; 327/538
[58] Field of Search .................... 307/652; 323/315, 323/316; 324/166, 173, 174, 207.25; 327/4, 39, 47, 102, 187, 423, 489, 490, 510, 511, 538

[56] References Cited

U.S. PATENT DOCUMENTS

| | | | |
|---|---|---|---|
| 3,721,968 | 3/1973 | Gee | 340/195 |
| 3,794,855 | 2/1974 | Gee | 307/290 |
| 3,933,141 | 1/1976 | Gunderson | 123/148 |
| 4,166,248 | 8/1979 | Bianchi et al. | 327/102 |
| 4,185,279 | 1/1980 | Bachman | 340/271 |
| 4,363,979 | 12/1982 | Honig et al. | 327/102 |

FOREIGN PATENT DOCUMENTS

| | | |
|---|---|---|
| 2559618 | 8/1985 | France . |
| 2646298 | 10/1990 | France . |
| 3208262 | 2/1982 | Germany . |

Primary Examiner—Timothy P. Callahan
Assistant Examiner—Jeffrey Zweizig
Attorney, Agent, or Firm—Michael J. Striker

[57] ABSTRACT

A switching arrangement for a signal processing comprises a sensor for sensing a movable part and having an inductivity, and a control reflecting circuit connected with the inductivity of the sensor, the current reflecting circuit having a transistor with a base which is directly connected with the inductivity of the sensor, the current reflecting circuit having one side connected with a voltage supply and another side connected with a resistance at which a measuring signal is pickable, and the current reflecting circuit actuates a current amplification.

8 Claims, 1 Drawing Sheet

000005,559,454

CIRCUIT ARRANGEMENT FOR SIGNAL PROCESSING FOR INDUCTIVITY USING SENSOR

BACKGROUND OF THE INVENTION

The present invention relates to a circuit arrangement for signal processing for an inductive sensor.

It is known to utilize inductive sensors for many different measuring value determinations, in particular in connection with recognition of the position of movable parts or for a rotation rate determination, for example for determining wheel speed in lock braking systems (ABS) or for determining the rotation rate of the crankshaft and camshaft of an internal combustion engine.

Since the output signals of the inductive sensors depend substantially from the speed of the moving parts as well as from the distance between the parts to be sensed and the sensor, it is necessary to process the output signals in a specific way. German document DE-OS 32 08 262 discloses for example the approach that the output signals of an inductive sensor are processed by means of a circuit arrangement which contains in addition to other parts also a current reflector, so that the reliable further processing is possible. In the known circuit the signal amplification is not however the core of the signal processing, but instead the so-called inherent adjustment is reduced by adjusting of threshold values to the signal height. Since the signal is however not amplified, with low speeds of the parts to be tested problems can occur since the signal to be evaluated is too small.

SUMMARY OF THE INVENTION

Accordingly, it is an object of the present invention to provide a circuit arrangement for signal processing for an inductive sensor, which avoids-the disadvantages of the prior art.

In keeping with these objects and with others which will become apparent hereinafter, one feature of the present invention resides, briefly stated, in a circuit arrangement for signal processing for an inductive sensor, in particular a rotation rate sensor, with a current reflecting circuit connected with the inductivity of the sensor, wherein in accordance with the present invention, the inductivity is directly connected with the base of at least one transistor of the current reflecting circuit, and the current reflecting circuit is connected on the one hand with a supply voltage terminal and on the other hand with a resistance at which the measuring signal is picked up, and actuates a current amplification.

When the circuit arrangement is designed in accordance with the present invention, it has the advantage that even with small speeds or small rotation rates as well as great distances between the sensor and the parts to be sensed, a signal is produced whose height provides a reliable further processing and in addition the obtained signal is very resistant to interferences. These advantages are obtained due to a suitable signal current amplification. The signal current amplification is provided by means of a current reflector with which the inductivity of the sensor is directly associated.

In accordance with further features of the present invention, the circuit arrangement is designed so that the sensor coil advantageously is smaller than sensor coils in known systems. Further, it is advantageous that the sensor and the evaluating circuit can be integrated in a single unit and due to the current evaluation only a two wire interface is required.

It is also especially advantageous that a simple error monitoring or recognition is possible by monitoring the signal level.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
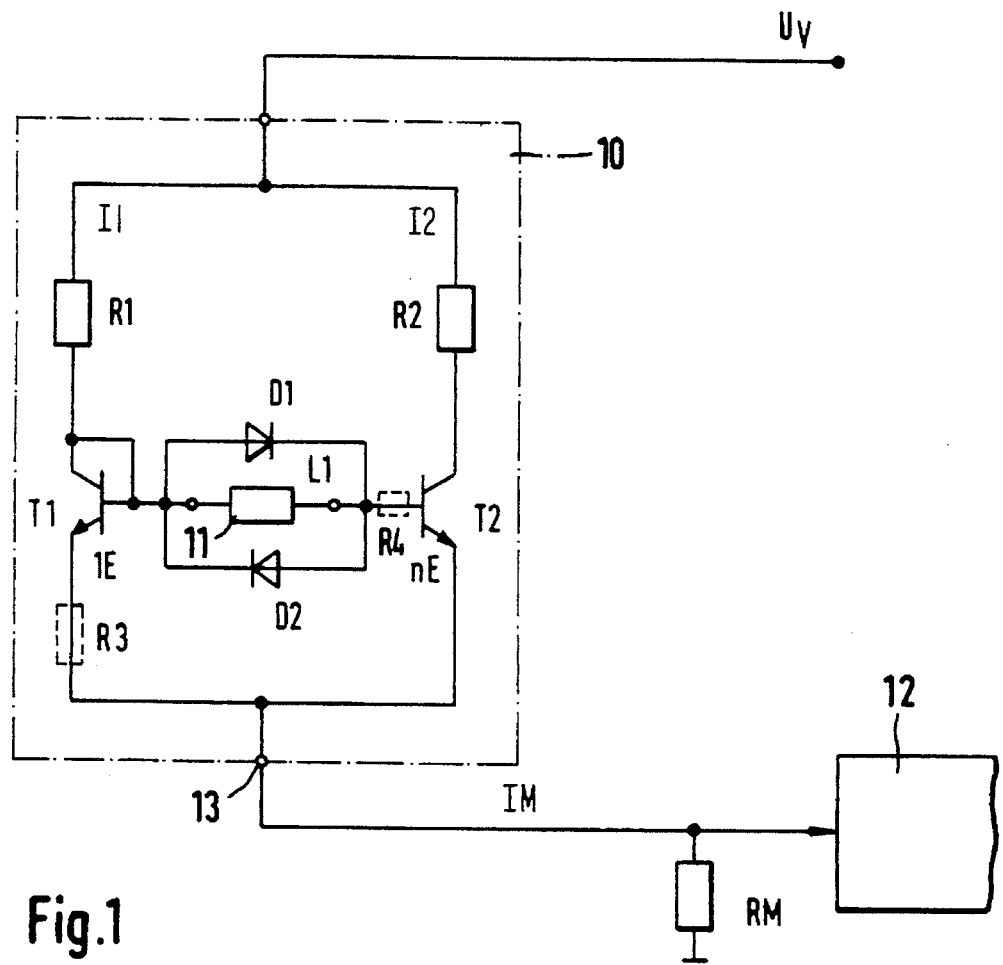
FIG. 1 is a view showing a circuit arrangement for signal processing for an inductive sensor in accordance with one embodiment of the invention.

FIG. 1 shows a sensor unit 10 which has a sensor coil 11 with an inductivity L1 as well as with an associated current reflecting circuit. One side of the sensor unit 10 is connected with a voltage supply for supplying the voltage Uv, while the other side of the sensor unit 10 is connected through a measuring resistance RM to a ground and also with a signal evaluating unit, for example a control device 12 of a motor vehicle.

The circuit arrangement for signal processing includes, in addition to the sensor coil 11, also two transistors T1, T2 which operate as a current reflector and each connected with a base of one of the both ends of the coil 11.

The collectors of both transistors T1, T2 are supplied through resistors R1 or R2 with the supply voltage Uv, and the emitter of both transistors T1 and T2 are connected with the resistance RM. The collector of the transistor T1 is connected with the base of the transistor T1.

Two anti-parallel connected diodes D1, D2 are connected parallel to the coil 11 with the inductivity L1. Both transistors T1 and T2 are in the shown example npn-transistors. A correspondingly changed circuit can be also formed with the use of pnp-transistors.

In the shown circuit the current I1 flows through the resistor R1 and the transistor T1. The current I1 is reflected through the coil 11 with the inductive L1 away from the transistor T2. Both transistors T1 and T2 therefore represent a current reflecting circuit. The current I2 which flows through the resistor R2 as well as the transistor T2 is dependent from the emitter ratio of the transistors T2 to T1, in accordance with the following:

$$I2 = n*I1$$

wherein n is the emitter ratio of the transistor T2 to the transistor T1.

The transistor T2 operates in an active region and can be controlled by smallest base current changes. When in the coil 11 due to the movement of a body which influences the magnetic conditions on the coil 11 a current is induced, this current superposes with the base main current of the transistor T2 and controls the transistor T2. The current I2 changes therefore with the current amplification factor of the transistor T2. Therefore an effective current amplification occurs.

The current change is finally supplied for evaluation. The current or the current change is transmitted through the interface 13 as well as the connected conductor, and is then detected at the receiving side of the measuring resistor RM and evaluated in the control device 12. It is important that the already amplified signals are transmitted, and thereby the transmitted signal power is higher than in the known inductive sensors whereby an especially good interface safety is provided.

Both diodes D1 and D2 limit the voltage through the coil 11, so that an optimal voltage region is not left. The resistor R2 limits the current I2 when the transistor T2 is completely controlled, or in other words in conductive condition. The current reflecting circuit including the coil 11 can be also formed as a single component, as a sensor unit. Thus, an integration of the circuit in the sensor is possible. Since the current is amplified by means of the transistor T2, the coil 11 can be formed smaller than in the known inductive sensors.

The measuring IM which is supplied to the control device 12 can be analyzed in a conventional manner by means of a level monitoring or in other words by comparison of the signal level (current or voltage) with a reference level, so as to determine whether a short circuiting in one of the supply conduits or a breakage near one of the supply conduits or a breakage in the coil occur.

The above described circuit arrangement can be completed with two resistors R3 and in some cases R4. They are located between the base of the transistor T2 and the coil 11 or between the emitter of the transistor T2 and the two-wire interface 11.

The resistor R3 compensates the voltage drop over the resistance of the coil and in some cases the resistor R4. The resistor combination R3 and R4 compensates a part of the temperature-dependent resistance changes of the resistance of the coil 11.

Figure 2:
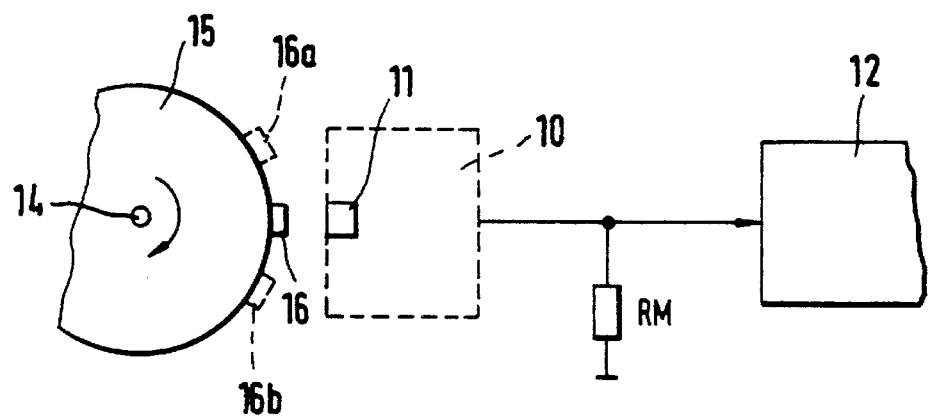
FIG. 2 shows how the sensor together with the circuit arrangement of FIG. 1 can be used for determination of the rotation rate of a rotatable part, for example a wheel or a transducer disc.

FIG. 2 schematically shows how the sensor unit, or in other words the sensor coil 11 together with the associated evaluating device can be utilized for determination of the rotation rate of a body 15 which rotates about an axis 14. It can be seen that the rotating body 15 is provided on its surface with an angle mark 16 or several angle marks 16, 16a, 16b arranged so that when they pass by a voltage or a current is induced in the coil 11. This voltage or current is amplified by means of the current reflecting circuit and finally is available as a measuring current IM for further evaluation, for example in the control device 12.

With the arrangement shown in FIG. 2 a pulse-shaped measuring current IM is produced, and the desired rotation rate can be determined in a conventional manner from the time intervals of the individual pulses. Actually almost rotatable or movable body can be tested.

The distance between the control coil 11 and the body to be tested is selected so that in the coil at least a minimal current is induced. This distance can be greater than in conventional inductive sensors because of the directly following signal amplification.

It will be understood that each of the elements described above, or two or more together, may also find a useful application in other types of constructions differing from the types described above.

While the invention has been illustrated and described as embodied in a circuit arrangement for signal processing for inductivity using sensor, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A circuit arrangement for a signal processing, comprising a sensor for sensing a movable part and having an inductivity formed as a coil; and a current reflecting circuit connected with said inductivity of said sensor, said current reflecting circuit actuating a current amplification and including a transistor with a base which is directly connected with said inductivity of said sensor, and a further transistor having a base additionally connected with said inductivity of said sensor, said transistors having connectors to which a supply voltage is supplied via a first interface and emitters connected with a resistance RM at which a measuring signal is pickable through a second interface, said circuit arrangement also including a first additional resistor located between said base of said further transistor and said coil and a second additional resistor located between said emitter of said first mentioned transistor and said resistance RM.

2. A circuit arrangement as defined in claim 1; and further comprising a voltage supply terminal which provides the voltage supply and two resistors each provided between a corresponding one of said collectors of said of said transistors and said voltage supply terminal.

3. A circuit arrangement as defined in claim 1; and further comprising two anti-parallel connected diodes arranged parallel to said inductivity of said sensor.

4. A circuit arrangement sa defined in claim 1, wherein said inductivity of said sensor is a coil, said coil together with said current reflecting circuit forming a single unit.

5. A circuit arrangement as defined in claim 1, wherein said inductivity of said sensor is formed so that it can be influenced by a movable part with a characteristic outer area, so that a measuring signal changes in dependence from the outer area of the movable part and its speed.

6. A circuit arrangement as defined in claim 1; and further comprising a control device to which the measuring signal amplified by said current reflecting circuit is supplied and in which the amplified signal is evaluated, said control device being formed to determine a rotation rate of the movable part.

7. A circuit arrangement as defined in claim 6, wherein said control device is a control device of a motor vehicle, while the movable part is a part selected from the group consisting of the wheel or a shaft which rotates the wheel.

8. A circuit arrangement as defined in claim 6, wherein said control device is formed so that a monitoring of a level of the supplied signal is performed and when implausibility is detected an error is recognized and a corresponding indicating device is released.

\* \* \* \* \*